(12) United States Patent
Tamari

(10) Patent No.: US 8,466,494 B2
(45) Date of Patent: Jun. 18, 2013

(54) FIELD EFFECT TRANSISTOR, SEMICONDUCTOR SWITCH CIRCUIT, AND COMMUNICATION APPARATUS

(75) Inventor: Shinichi Tamari, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/396,127

(22) Filed: Feb. 14, 2012

(65) Prior Publication Data

US 2012/0211802 A1 Aug. 23, 2012

(30) Foreign Application Priority Data

Feb. 23, 2011 (JP) ................................. 2011-036537

(51) Int. Cl.
*H01L 29/778* (2006.01)

(52) U.S. Cl.
USPC .......................................................... 257/192

(58) Field of Classification Search
USPC ........................... 257/192, 194, 262, 272, 274
See application file for complete search history.

(56) References Cited

U.S. PATENT DOCUMENTS

| | | | |
|---|---|---|---|
| 6,198,130 B1 * | 3/2001 | Nobuto et al. ................ | 257/343 |
| 6,365,925 B2 * | 4/2002 | Hase et al. .................... | 257/194 |
| 6,759,282 B2 * | 7/2004 | Campbell et al. ............. | 438/149 |
| 6,867,115 B2 * | 3/2005 | Asano et al. .................. | 438/523 |
| 2005/0029592 A1 * | 2/2005 | Campbell et al. ............. | 257/347 |
| 2005/0274979 A1 * | 12/2005 | Asano ............................ | 257/192 |
| 2006/0249752 A1 * | 11/2006 | Asano ............................ | 257/197 |
| 2009/0302392 A1 * | 12/2009 | Slesazeck ...................... | 257/369 |

FOREIGN PATENT DOCUMENTS

JP 11-150264 6/1999

* cited by examiner

*Primary Examiner* — Thao P. Le
(74) *Attorney, Agent, or Firm* — Dentons US LLP

(57) ABSTRACT

A field effect transistor includes a source wiring that is formed on a compound semiconductor substrate, and has a plurality of source electrodes arranged in parallel to each other at predetermined intervals, a drain wiring that is formed on the compound semiconductor substrate, and has a plurality of drain electrodes arranged in parallel to each other at predetermined intervals and alternatively disposed in a parallel direction of the plurality of source electrodes, a gate wiring that is formed on the compound semiconductor substrate, and has a portion located between the source electrode and the drain electrode which are adjacent to each other at least in the parallel direction, and a plurality of buried gate layers that is formed under the gate wiring in a region in which the gate wiring is formed, and is independently provided between each electrode of the source electrodes and the drain electrodes.

4 Claims, 9 Drawing Sheets

(BASIC FREQUENCY: 1.95 GHz)

(BASIC FREQUENCY: 1.95 GHz)

FIELD EFFECT TRANSISTOR, SEMICONDUCTOR SWITCH CIRCUIT, AND COMMUNICATION APPARATUS

BACKGROUND

The present disclosure relates to a field effect transistor, a semiconductor switch circuit, and a communication apparatus which use a compound semiconductor.

In the related art, in communication apparatuses such as a mobile phone, and the like, an FET (Field Effect Transistor) has been used as a switching element constituting a semiconductor switch so as to switch a path of, for example, a high frequency signal that is transmitted and received to and from antennas. As the FET used in the high frequency signal, an FET using a compound semiconductor such as GaAs (gallium arsenide), and the like have been widely known.

As examples of the FET, an HEMT (High Electron Mobility Transistor), a PHEMT (Pseudomorphic HEMT) that is a modified example of the HEMT, and realizes higher electron mobility by allowing lattice mismatch to a permitted degree by an epitaxial structure and the like may be given. In addition, as the FET, a JPHEMT (Junction Pseudomorphic HEMT) that uses a PN junction in a gate unit for the purpose of improvement of a gate forward voltage has been known (For example, see Japanese Unexamined Patent Application Publication No. 11-150264

SUMMARY

In particular, in mobile phones, multi-mode and multi-band such as a GSM (registered trademark) (Global System for Mobile Communication) scheme, a WCDMA (Wideband Code Division Multiple Access) scheme, a CDMA (Code Division Multiple Access) scheme, and the like have been promoted. In order to respond to these multi-mode and multi-band, a semiconductor switch that can perform a switching among a plurality of paths at a low-loss has been used.

As one of the important characteristics used for the semiconductor switch that is used in the high frequency signal as described above, harmonic characteristics (harmonic distortion) during transmission operation of signals may be given. The harmonic characteristics show harmonic distortion characteristic components generated, when a high-powered transmission signal is input to the semiconductor switch, as a frequency component that is an integer multiple of a frequency of the input transmission signal. When the frequency of the input transmission signal is made a basic frequency, frequency components that are twice and thrice the basic frequency are respectively second harmonics and third harmonics, which become harmonic distortion.

The harmonic distortion as the above described distortion component interferes with a frequency adjacent to the frequency to thereby be an interference wave to other applications using a frequency in which the harmonic distortion occurs. Therefore, it is necessary to minimize an amount of occurrence of the harmonic distortion.

In order to suppress the harmonics, methods such as improving linearity of on-resistance of the FET in an ON state, or improving power resistance characteristics of the FET in an OFF state have been used. To improve the linearity of the on-resistance of the FET in the ON state, the size of the FET may be generally increased. However, the increase in the size of the FET causes an increase in the chip size of the semiconductor switch.

It is desirable to provide a field effect transistor, a semiconductor switch circuit, and a communication apparatus, which may improve harmonic characteristics without increasing the chip size of the semiconductor switch.

According to an embodiment of the present disclosure, there is provided a field effect transistor, including: a source wiring that is formed on a compound semiconductor substrate, and has a plurality of source electrodes arranged in parallel to each other at predetermined intervals; a drain wiring that is formed on the compound semiconductor substrate, and has a plurality of drain electrodes arranged in parallel to each other at predetermined intervals and alternatively disposed in a direction parallel to the plurality of source electrodes; a gate wiring that is formed on the compound semiconductor substrate, and has a portion located between the source electrode and the drain electrode which are adjacent to each other at least in the parallel direction; and a plurality of buried gate layers that are formed under the gate wiring in a region in which the gate wiring is formed, and is independently provided between each electrode of the plurality of source electrodes and the plurality of drain electrodes.

In this instance, each of the plurality of buried gate layers may be formed in a straight-line shape by a portion existing within an operation region on the compound semiconductor substrate including a portion in which the source electrode and the drain electrode are overlapped in the parallel direction between the source wiring and the drain wiring, and by a portion existing in a region other than the operation region, and the portion existing in the region other than the operation region may have a minimum length used to ensure an operation in the operation region.

According to another embodiment of the present disclosure, there is provided a semiconductor switch circuit including the field effect transistor. Here, the semiconductor switch circuit may have an input terminal connected to a gate of the field effect transistor through a resistance element, and may be operated by a switching signal input to the input terminal.

According to an embodiment of the present disclosure, there is provided a communication apparatus including the semiconductor switch circuit. Here, the communication apparatus may perform path switching of a signal by an operation of the semiconductor switch circuit.

DETAILED DESCRIPTION OF EMBODIMENTS

Figure 1:
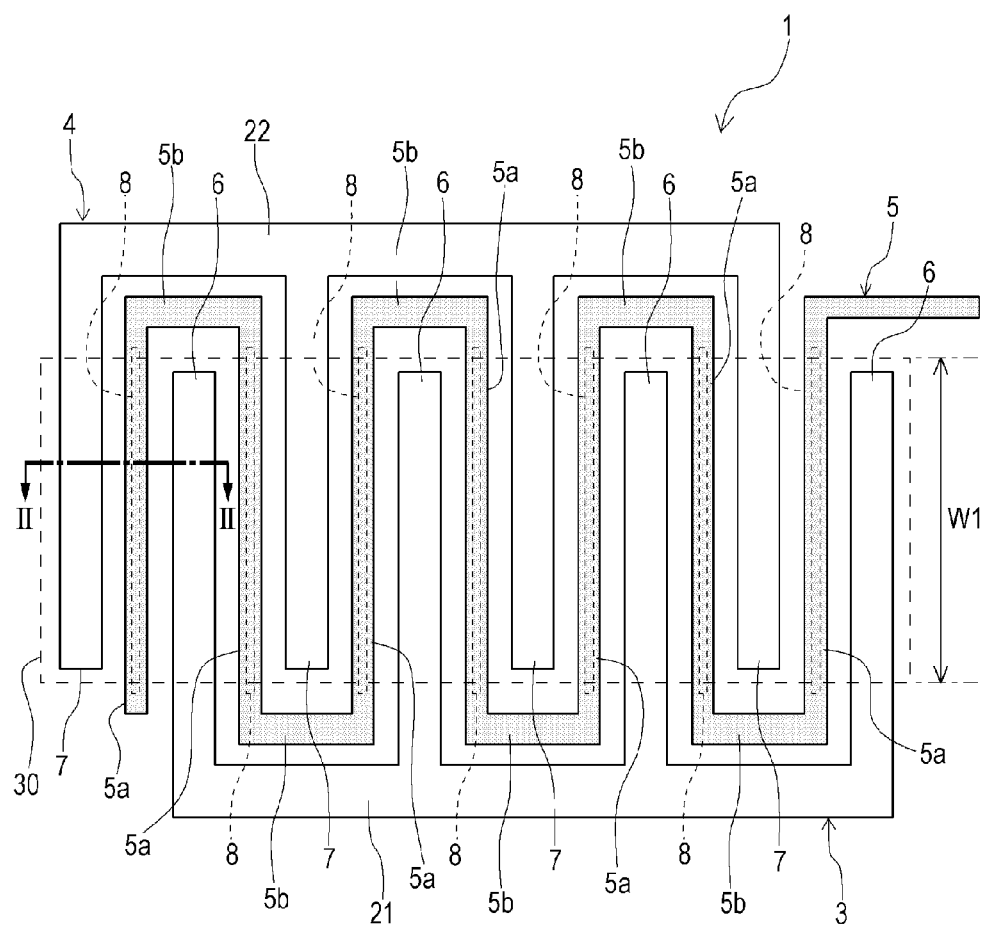
FIG. 1 is a plan view illustrating a configuration of a field effect transistor according to an embodiment of the present disclosure.

Embodiments of the present disclosure are to devise a layout having a buried gate layer 8 that is formed under wiring of a gate wiring having a portion of routing other than an operation region (a channel region) of a Field Effect Transistor (Hereinafter, referred to as FET) to thereby improve harmonic characteristics.

[Schematic Configuration of FET]

A configuration of an FET 1 according to an embodiment of the disclosure will be described with reference to FIGS. 1 and 2. In addition, FIG. 2 is a partial cross-sectional view across II-II of FIG. 1. The FET 1 according to the present embodiment is used as a switching element constituting a semiconductor switch for the purpose of path switching of high frequency signals that are transmitted and received to/from, for example, an antenna of a mobile phone. The FET 1 according to the present embodiment is configured as JPHEMT. However, this technology may be widely applicable to a general FET such as an HEMT, a PHEMT, and the like other than the JPHEMT.

The present FET 1 is configured using a compound semiconductor substrate 2 formed by a compound semiconductor such as GaAs, and the like. As shown in FIGS. 1 and 2, the FET 1 includes a source wiring 3, a drain wiring 4, and a gate wiring 5, which are formed on the compound semiconductor substrate 2, through a laminated structure that is formed on the compound semiconductor substrate 2. The source wiring 3 has a plurality of source electrodes 6, and the drain wiring 4 has a plurality of drain electrodes 7. In addition, the FET 1 includes a buried gate layer 8 that is formed under the gate wiring 5 (the compound semiconductor substrate 2 side).

As shown in FIG. 2, the FET 1 includes a buffer layer 11, a lower barrier layer 12, a channel layer 13, and an upper barrier layer 14 in order from the side of the compound semiconductor substrate 2 as the laminated structure formed on the compound semiconductor substrate 2. These layers are sequentially formed on the compound semiconductor substrate 2 by epitaxial growth. In addition, the lower barrier layer 12 and the channel layer 13, and the channel layer 13 and the upper barrier layer 14 are joined by a heterojunction.

The buffer layer 11 is formed on the compound semiconductor substrate 2 for the purpose of improving crystal growth. The buffer layer 11 is preferably not doped, however, the buffer layer 11 to which an impurity having a sufficiently low concentration are added may be used.

The lower barrier layer 12 includes a lower doped layer 12a and a lower spacer layer 12b that is formed on the lower doped layer 12a. The lower doped layer 12a is formed by AlGaAs (Aluminum gallium arsenide) to which an n-type impurity is added, and the lower spacer layer 12b is formed by, for example, undoped AlGaAs.

The channel layer 13 is formed by, for example, undoped InGaAs (Indium gallium arsenide). The channel layer 13 functions as a current between the source electrode 6 and the drain electrode 7.

The upper barrier layer 14 includes an upper spacer layer 14a, an upper doped layer 14b that is formed on the upper spacer layer 14a, and a diffusion layer 14c that is formed on the upper doped layer 14b. The upper spacer layer 14a is formed by, for example, undoped AlGaAs, and the upper doped layer 14b is formed by, for example, AlGaAs to which an n-type impurity is added. The diffusion layer 14c is formed by, for example, AlGaAs to which an n-type impurity is added. A concentration of the impurity of the diffusion layer 14c is lower than a concentration of each of the lower doped layer 12a and the upper doped layer 14b.

In addition, as shown in FIG. 2, in a predetermined position of the upper barrier layer 14, cap layers 15a and 15b are formed at predetermined intervals. On the upper barrier layer 14 in the state in which the cap layers 15a and 15b are formed, an insulation film 16 is formed while including the cap layers 15a and 15b. That is, outer surfaces of the upper barrier layer 14 and the cap layers 15a and 15b that are formed on the upper barrier layer 14 are covered by the insulation film 16. The cap layers 15a and 15b are formed by GaAs to which silicon is added as, for example, an n-type impurity. The insulation layer 16 is formed by, for example, $Si_3N_4$.

The source electrode 6 and the drain electrode 7 are formed on the cap layers 15a and 15b. In FIG. 2, the source electrode 6 is formed on the cap layer 15a on the left side, and the drain electrode 7 is formed on the cap layer 15b on the right side. On the cap layer 15a of the insulation film 16, an opening 16a for forming the source electrode 6 on the cap layer 15a is formed. The source electrode 6 is formed on the cap layer 15a in the state of being exposed to the outer surface through the opening 16a of the insulation film 16. Similarly, on the cap layer 15b of the insulation film 16, an opening 16b for forming the drain electrode 7 is formed, so that the drain electrode 7 is formed on the cap layer 15b in the state of being exposed to the outer surface through the opening 16b.

In addition, on the upper barrier layer 14, the gate wiring 5 is formed between the source electrode 6 and the drain electrode 7, that is, between the cap layer 15a and the cap layer 15b. On the insulation film 16, an opening 16c for forming the gate wiring 5 on the upper barrier layer 14 is formed. The gate wiring 5 is formed on the upper barrier layer 14 in the state of being exposed to the outer surface through the opening 16c of the insulation film 16.

The source electrode 6 and the drain electrode 7 are formed in a manner such that, for example, AuGe (gold germanium), Ni (nickel), and Au (gold) are sequentially laminated. Between the source electrode 6 and the cap layer 15a and between the drain electrode 7 and the cap layer 15b, ohmic contact is respectively allowed. The gate wiring 5 is formed in a manner such that, for example, Ti (titanium), Pt (platinum), and Au are sequentially laminated.

As described above, in the upper barrier layer 14, the source electrode 6 and the drain electrode 7 are formed respectively, through the insulation film 16, on the cap layers 15a and 15b which are provided at a predetermined interval, so that the gate wiring 5 is formed through the insulation film 16 between the source electrode 6 and the drain electrode 7. By the insulation film 16, insulation between the source electrode 6 and the gate wiring 5 and between the gate wiring 5 and the drain electrode 7 is ensured.

In addition, directly under the gate wiring 5 within the diffusion layer 14c of the upper barrier layer 14, the buried gate layer 8 is formed. An upper side of the buried gate layer 8 is connected to a lower side of the gate wiring 5. The buried gate layer 8 is located between the gate wiring 5 and the diffusion layer 14c, and formed as a p-type region in which Zn (zinc) that is a p-type impurity is diffused in a part of the diffusion layer 14c. The gate wiring 5 functions as an extraction electrode of the buried gate layer 8 with respect to the buried gate layer 8. In addition, the cap layers 15a and 15b that are formed on the upper barrier layer 14 are formed in a position other than a position in which the buried gate layer 8 is formed on the diffusion layer 14c.

A wiring layout (wiring pattern) in the FET 1 will be described with reference to FIG. 1. In addition, for convenience of description below, upper, lower, left, and right sides of FIG. 1 correspond to upper, lower left, and right sides in a plan view of the FET 1.

Figure 2:
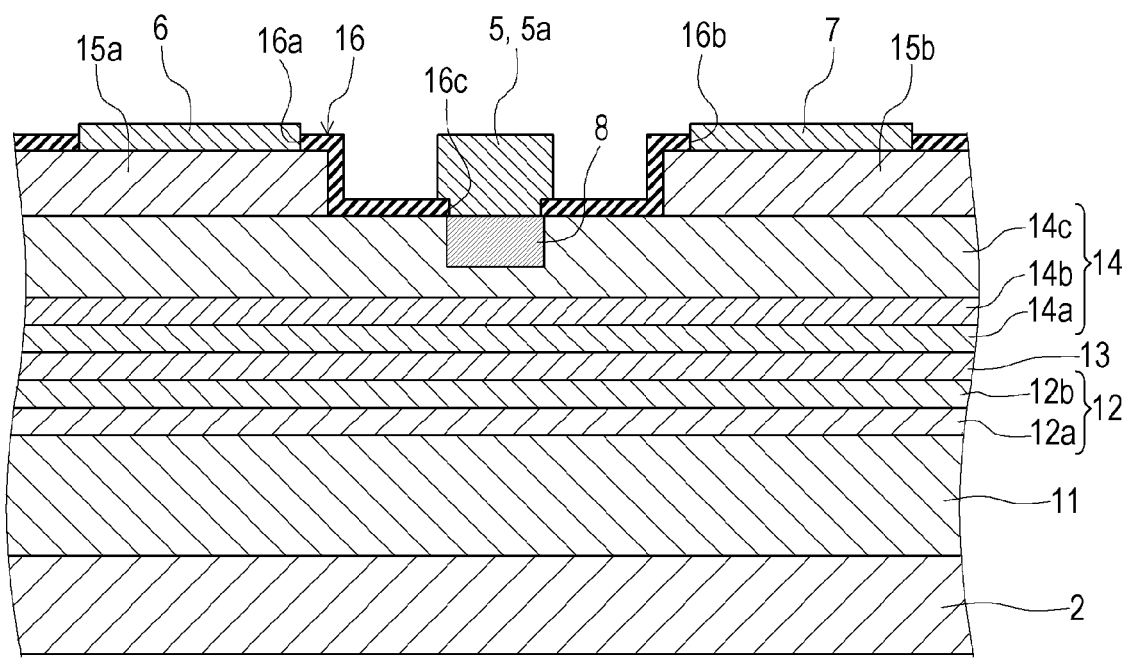
FIG. 2 is a cross-sectional view illustrating a configuration of a field effect transistor according to an embodiment of the present disclosure.

As shown in FIG. 1, both the source wiring 3 and the drain wiring 4 included in the FET 1 have a comb-shaped pattern shape in the plan view of the FET 1, which is equivalent to the plate surface directional view of the compound semiconductor substrate 2.

The source wiring 3 includes a plurality of source electrodes 6 that is formed on the compound semiconductor substrate 2 through a laminated structure including the buffer layer 11, and the like as described above, and arranged in parallel to each other at predetermined intervals. The source wiring 3 includes a wiring portion 21 that is formed into a strip shape in the lateral direction, and the plurality of source electrodes 6 that is formed into a strip shape in a vertical direction towards an upper side from the wiring portion 21. The plurality of source electrodes 6 is formed in parallel to each other at predetermined intervals in the lateral direction.

The FET 1 according to the present embodiment has four source electrodes 6. The wiring portion 21 of the source wiring 3 is connected to an electrode pad which is not shown so that a voltage applied to the electrode pad is applied to each of the plurality of source electrodes 6 through the wiring portion 21. In addition, under the source electrode 6, a strip-shaped electrode is formed by an ohmic metal layer (AuGe/Ni/Au) that comes into ohmic contact with the compound semiconductor substrate 2.

The drain wiring 4 includes a plurality of drain electrodes 7 that is formed on the compound semiconductor substrate 2 through the laminated structure including the buffer layer 11, and the like as described above, and is alternatively disposed in a parallel direction of the plurality of source electrodes 6. The drain wiring 4 includes a wiring portion 22 that is formed into a strip shape in the lateral direction, and the plurality of drain electrodes 7 that is formed into a strip shape in the vertical direction towards a lower side from the wiring portion 22. The plurality of drain electrodes 7 is formed in parallel to each other at predetermined intervals in the lateral direction.

The FET 1 according to the present embodiment has four drain electrodes 7. The wiring portion 22 of the drain wiring 4 is connected to an electrode pad which is not shown, so that a voltage applied to the electrode pad is applied to each of the plurality of drain electrodes 7 through the wiring portion 22. In addition, under the drain electrode 7, a strip-shaped electrode is formed by the ohmic metal layer that comes into ohmic contact with the compound semiconductor substrate 2.

Both wirings of the source wiring 3 and the drain wiring 4 put the source electrode 6 and the drain electrode 7, which are the comb-tooth portion in the comb-shaped pattern, to face to each other, so that both wirings are formed in a manner such that the comb tooth portions are engaged with each other. Thus, the source electrode 6 and the drain electrode 7 are alternatively disposed in the lateral direction (the parallel direction) between the source wiring 3 and the drain wiring 4.

The gate wiring 5 is formed between the source wiring 3 and the drain wiring 4. The gate wiring 5 is a so-called meander type wiring that is arranged to meander in a serpentine way between the source electrode 6 and the drain electrode 7 which face each other.

The gate wiring 5 includes a straight-line portion 5a that is formed in the vertical direction, a routing portion 5b in which the straight-line portions 5a adjacent to each other are alternatively connected to at least upper or lower end portion, so that the straight-line portion 5a and the routing portion 5b are alternately continued in the lateral direction. The straight-line portion 5a is positioned between the source electrode 6 and the drain electrode 7 which are formed in the vertical direction. The routing portion 5b is positioned between a tip of the source electrode 6 or the drain electrode 7 and the wiring portion 22 of the drain wiring 4 or the wiring portion 21 of the source wiring 3. In the present embodiment, in the straight-line portions 5a that are positioned both the left and right sides of the source electrode 6, upper end portions are connected to each other by the routing portion 5b, and in the straight-line portions 5a that are positioned in both the left and right sides of the drain electrode 7, lower end portions are connected to each other by the routing portion 5b.

In this manner, the gate wiring 5 is formed on the compound semiconductor substrate 2 by the laminated structure including the buffer layer 11, and the like as described above, thereby having the straight-line portion 5a that is a portion positioned between the source electrode 6 and the drain electrode 7 that are adjacent to each other in the parallel direction (in the lateral direction). The gate wiring 5 is formed in a continuous manner by the routing portion 5b while having the straight-line portion 5a between the source electrode 6 and the drain electrode 7.

The FET 1 having the configuration as above has an operation region 30 as shown by the region surrounded by dashed lines in FIG. 1. The operation region 30 is an impurity region, and is defined as a channel region having a predetermined channel width W1. In the operation region 30, the source electrode 6, the straight-line portion 5a of the gate wiring 5, the drain electrode 7, and the straight-line portion 5a of the gate wiring 5 are repeatedly formed in the stated order at predetermined intervals in the lateral direction.

In the FET 1 according to the present embodiment, as shown in FIG. 1, four source electrodes 6 and four drain electrodes 7 are present in the operation region 30, and at the same time, the straight-line portion 5a of the gate wiring 5 is present at seven positions between respective electrodes. The four source electrodes 6 are connected to the wiring portion 21 of the source wiring 3 in a region other than regions in the lower side of the operation region 30, and the four drain electrodes 7 are connected to the wiring portion 22 of the drain wiring 4 in a region other than regions in the upper side of the operation region 30.

As described above, in the FET 1 according to the present embodiment, the operation region 30 is a region on the compound semiconductor substrate 2 including a portion in which the source electrode 6 and the drain electrode 7 are overlapped in the parallel direction (the lateral direction) between the source wiring 3 and the drain wiring 4. Here, the portion in which the source electrode 6 and the drain electrode 7 overlap is a portion in which the plurality of source electrodes 6 and the plurality of drain electrodes 7 are engaged with each other in the vertical direction as the comb-tooth portion, that is, a portion in which the source electrode 6 and the drain electrode 7 overlap in the lateral direction to be alternately present.

[Detailed Configuration of FET]

A detailed configuration of the FET 1 according to the present embodiment will be described with reference to FIG. 3. In the FET 1, as described above, the buried gate layer 8 is present under the gate wiring 5. In addition, in FIG. 3, the buried gate layer 8 that is present under the gate wiring 5 (the side of the compound semiconductor substrate 2) is, for convenience, shown by solid lines. The buried gate layer 8 is partially and discontinuously provided with respect to a wiring shape (hereinafter, referred to as a "gate wiring shape") of the gate wiring 5 that is arranged between the source wiring 3 and the drain wiring 4 in a meandering shape.

Specifically, with respect to the gate wiring shape, the buried gate layer 8 is provided to correspond to a portion that is present between the source electrode 6 and the drain electrode 7. That is, in the present embodiment, the buried gate layer 8 is provided to correspond to each of the straight-line portions 5a which the gate wiring 5 has between the source electrode 6 and the drain electrode 7. Thus, the buried gate layer 8 is formed as a part of non-continuous multiple layers with respect to the gate wiring shape that is integrally continuous.

Accordingly, in the FET 1 according to the present embodiment in which the straight-line portions 5a of the gate wiring 5 are present in seven portions between respective electrodes as described above, the buried gate layer 8 is provided in seven portions to correspond to each of the straight-line portions 5a. In other words, with respect to the gate wiring shape, the buried gate layer 8 is provided only in portions corresponding to each of the straight-line portions 5a, and is not provided in a portion corresponding to the routing portion 5b in which the straight-line portions 5a are connected to each other.

In this manner, the buried gate layer 8 is provided to correspond to the straight-line portion 5a of the gate wiring 5, so that the buried gate layer 8 is mainly present within the operation region 30. In a portion of the gate wiring 5 other than the operation region 30, that is, a portion (a portion indicated by ellipses B1 and B2 shown by dashed lines) of the gate wiring 5 other than regions of both an upper side and a lower side of the operation region 30, the buried gate layer 8 is present as a significantly small portion with respect to a portion that is present within the operation region 30.

As described above, a plurality of buried gate layers 8 included in the FET 1 is formed under the gate wiring 5 in the region in which the gate wiring 5 is formed, and independently provided between each electrode of the plurality of source electrodes 6 and the plurality of drain electrodes 7. Here, the buried gate layer 8 is independently provided between each electrode means that the buried gate layer 8 is partially provided in a portion corresponding to each of the straight-line portions 5a without meandering like the gate wiring shape, with respect to the gate wiring 5 that is continuously formed in the meandering state by the straight-line portion 5a and the routing portion 5b.

The layout of the buried gate layer 8 will be described in detail. Each of the plurality of buried gate layers 8 that is mainly present within the operation region 30 is formed into a straight-line shape by the region inner portion 8a, that is, the portion that is present within the operation region 30, and a region outer portion 8b, that is, a portion that is present in a region other than the operation region 30 along the straight-line portion 5a of the gate wiring 5.

Figure 3:
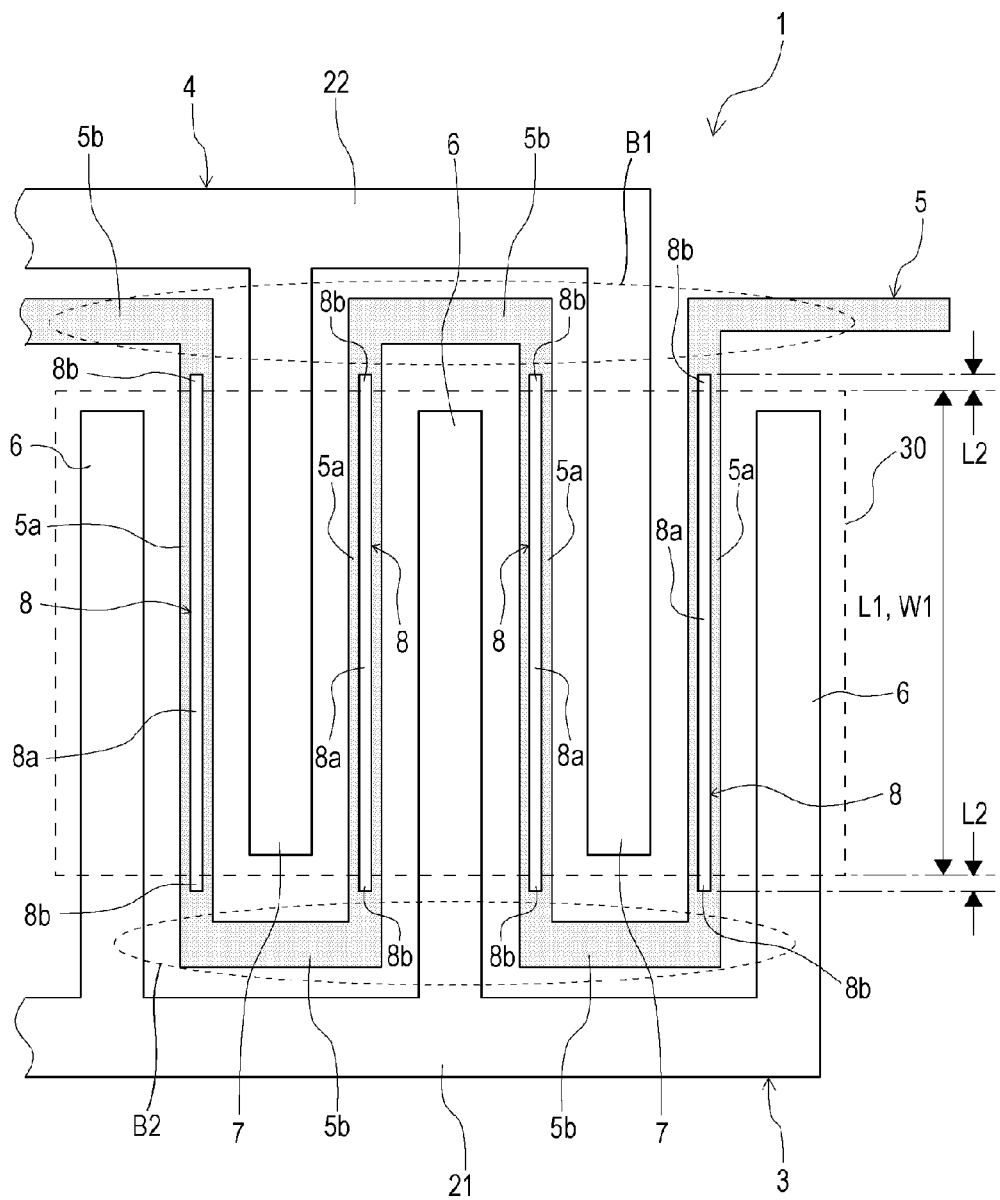
FIG. 3 is a partial plan view illustrating a configuration of a field effect transistor according to an embodiment of the present disclosure.

As shown in FIG. 3, with respect to the operation region 30 formed between the source wiring 3 and the drain wiring 4, each of the plurality of buried layers 8 has the region inner portion 8a that is present within the operation region 30, and the region outer portion 8b that is present in the portion other than the operation region 30 in the vertical direction of the region inner portion 8a. The region outer portion 8b of the buried gate layer 8 has a length which presents no problems to the operation of the FET 1, that is, the minimum length used to ensure operation in the operation region 30.

That is, as shown in FIG. 3, the buried gate layer 8 which is formed into a straight-line shape in the vertical direction in accordance with the straight-line portions 5a of the gate wiring 5, has a region inner portion 8a of a length L1 that is a vertical dimension, and a region outer portion 8b of a length L2, so that the length L2 of the region outer portion 8b is set as the minimum length used for securing the operation in the operation region 30. In addition, the length L1 of the region inner portion 8a matches a channel width W1.

The length L2 of the region outer portion 8b of the buried gate layer 8 is sufficiently shorter than the L1 of the region inner portion 8a. That is, in the buried gate layer 8 that is mainly present within the operation region 30, the region outer portion 8b of the buried gate layer 8 is a significantly short part that is slightly protruded upwards or downwards from the operation region 30 to the outside.

For example, when the length L1 of the region inner portion 8a of the buried gate layer 8 is about 50 μm, the length L2 of the region outer portion 8b of the buried gate layer 8 is set to be about 0.5 μm. However, the length L2 of the region outer portion 8b of the buried gate layer 8 is not particularly limited, and is appropriately set to the length used for ensuring operation in the operation region 30.

The FET 1 according to the present embodiment having the above described configuration may improve harmonic characteristics without increasing the chip size of the semiconductor switch. This is based on a fact that, in the FET 1 according to the present embodiment, it is possible to minimize a leakage current generated due to the presence of buried gate layer 8 in the region other than the operation region 30.

The above described effects will be described using an FET 100 that is a comparative example of the FET 1 according to the present embodiment. In addition, in the FET 100 that is the comparative example, the same configurations as those of the FET 1 according to the present embodiment have the same reference numbers as those of the FET 1, and descriptions thereof will be appropriately omitted.

Figure 4:
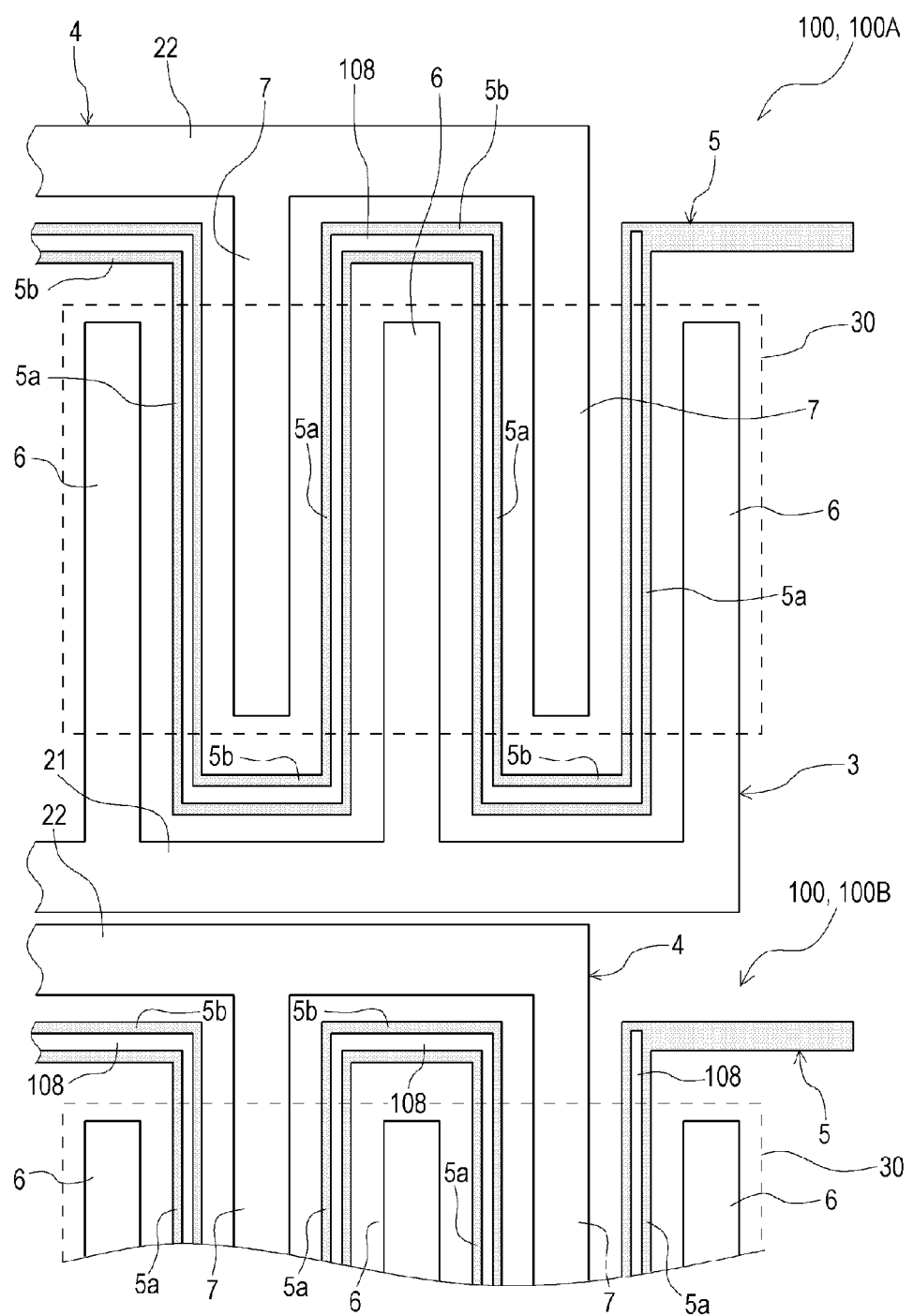
FIG. 4 is a partial plan view illustrating a configuration of a field effect transistor as a comparative example of the disclosure.

In FIG. 4, a configuration of the FET 100 that is the comparative example is shown. The FET 100 that is the comparative example is different from the FET 1 according to the present embodiment in that a buried gate layers 108 is formed in a relatively large region other than the operation region 30. In addition, in FIG. 4, the buried gate layer 108 that is originally present in a lower side (in the side of the compound semiconductor substrate 2) of the gate wiring 5 is, for convenience, shown by solid lines, similar to FIG. 3.

As shown in FIG. 4, in the FET 100 that is the comparative example, the buried gate layer 108 is continuously formed into a meandering shape to conform to the shape of the gate wiring 5. Accordingly, in the FET 100 that is the comparative example, the buried gate layer 108 is formed even in the routing portion 5b in which the straight-line portions 5a are continued with each other, in addition to the straight-line portion 5a of the gate wiring 5. Thus, in the FET 100 that is the comparative example, the buried gate layer 108 is formed even in the routing portion 5b that is present in a region other than the operation region 30, so that the buried gate layer 108 is continuously formed to conform to the shape of the gate wiring 5.

In general, the switching element is configured in a manner such that a plurality of FETs is connected in series with a plurality of terminals. The switching element configured by the plurality of FETs is arranged in series to be adjacent to each other in the corresponding direction (in the vertical direction), for example, in which the source wiring 3 and the drain wiring 4 of the FET 1 face, thereby constituting the semiconductor switch circuit. In the switching elements that are adjacent to each other in the vertical direction in the semiconductor switch circuit, an on state and an off state are alternatively switched.

In the semiconductor switch circuit having the above described configuration, when the FET 100 that is the comparative example as described above is used, the following phenomenon may occur. As shown in FIG. 4, in the semiconductor switch circuit, the FET 100B constituting a switching element which is different from that of the FET 100A is adjacent to one side (a lower side in FIG. 4) in the vertical direction, for example, with respect to the FET 100A constituting the switching element.

In this manner, when the FET 100A and FET 100B constituting mutually different switching elements are adjacent to each other in the vertical direction, a case in which a high frequency signal that is propagated in a predetermined path is leaked between the adjacent FETs 100A and 100B by on and off states of the switching element may occur. For example, when the FET 100 that is the comparative example is used in high power, a phenomenon in which the high frequency signal is leaked in the switching element that is in an off side occurs.

In the FET 100 that is the comparative example, the phenomenon in which the high frequency signal is leaked as described above is based on the fact that the buried gate layer 108 is present in the routing portion 5b other than the operation region 30. The leakage of the high frequency signal may cause a leakage current, so that the leakage current may cause harmonics such as second harmonics, third harmonics, and the like, thereby deteriorating harmonic characteristics.

In this respect, according to the FET 1 of the present embodiment, the buried gate layer 8 that is present in the region other than the operation region 30 is present only in the region outer portion 8b having a used minimum length, for example, in a state in which the FETs 1 constituting the different switching elements as described above are adjacent to each other, so that the phenomenon in which the high frequency signal is leaked may be suppressed. Thus, the leak current from the FET 1 may be suppressed, so that the harmonic characteristics are significantly improved. In addition, according to the FET 1 of the present embodiment, it is possible to suppress generation of the harmonic without increasing the size of the FET, so that enlargement of the chip size of the semiconductor switch is not incurred.

Figure 5:
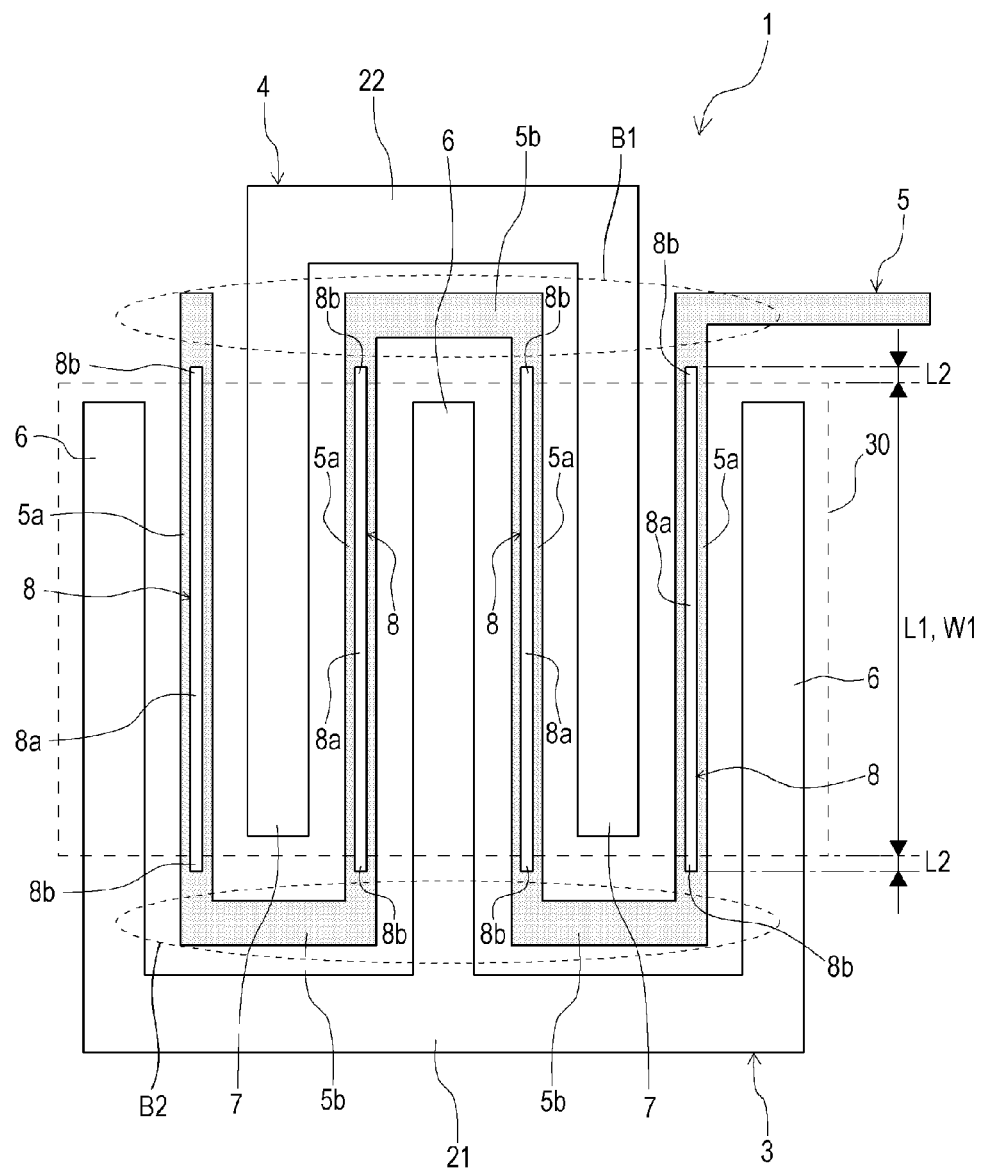
FIG. 5 is a view illustrating another configuration example of a field effect transistor according to an embodiment of the present disclosure.

The FET 1 of the present embodiment described as above has four source electrodes 6 and four drain electrodes 7 which are in a state of being meshed with each other, however, the number of the source electrodes 6 and the number of the drain electrodes 7 is not limited to the present embodiment. For example, as shown in FIG. 5, the source wiring 3 may have three source electrodes 6, and the drain wiring 4 may have two drain electrodes 7.

Figure 6:
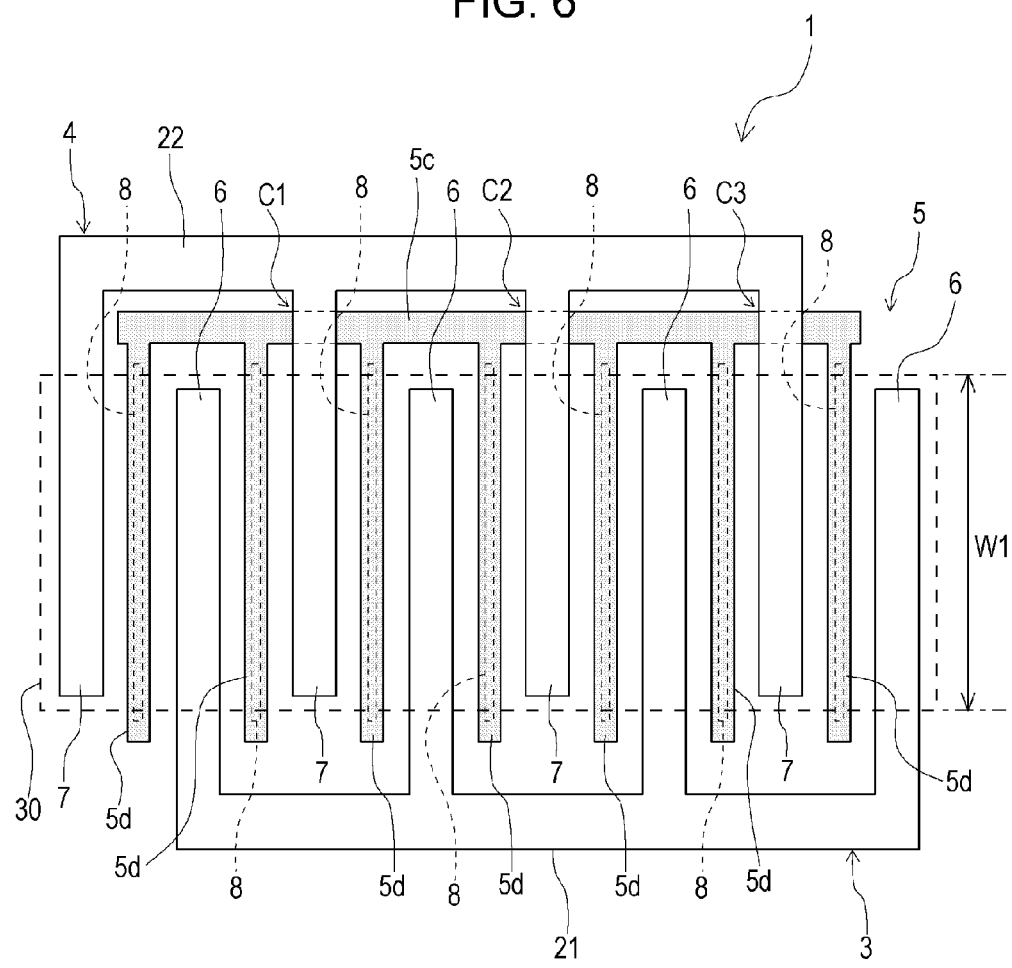
FIG. 6 is a view illustrating another configuration example of a field effect transistor according to an embodiment of the present disclosure.

In addition, in the FET 1 of the present embodiment, the gate wiring 5 is a so-called meander-type wiring, however, may be a comb type wiring as shown in FIG. 6. In this case, the gate wiring 5 is formed in a lower side (the side of the compound semiconductor substrate 2) of the source wiring 3 or the drain wiring 4, and crosses via a nitride film or the like between the source wiring 3 or the drain wiring 4.

In the example shown in FIG. 6, the gate wiring 5 includes a base portion 5c that is a routing portion formed into a straight-line shape in the lateral direction, and a plurality of straight-line portions 5d that are comb tooth portions disposed in parallel to each other at predetermined intervals from the base portion 5c to a lower side, and is formed into a comb shape. The gate wiring 5 has a portion that crosses the drain wiring 4 in plan view in the base portion 5c (see, reference numbers C1, C2, and C3). In this manner, the gate wiring 5 has the straight-line portion 5d that is a portion positioned between the source electrode 6 and the drain electrode 7, and may be continuously formed as a comb-shaped wiring by the base portion 5c.

[Configuration of Semiconductor Switch Circuit]

A configuration of a switch circuit 50 that is an embodiment of the semiconductor switch circuit as an application example of the FET 1 of the present embodiment will be described with reference to FIG. 7. In addition, in the present embodiment, an example in which the FET 1 is applied to an SPST (Single Pole Single Throw) circuit will be described.

Figure 7:
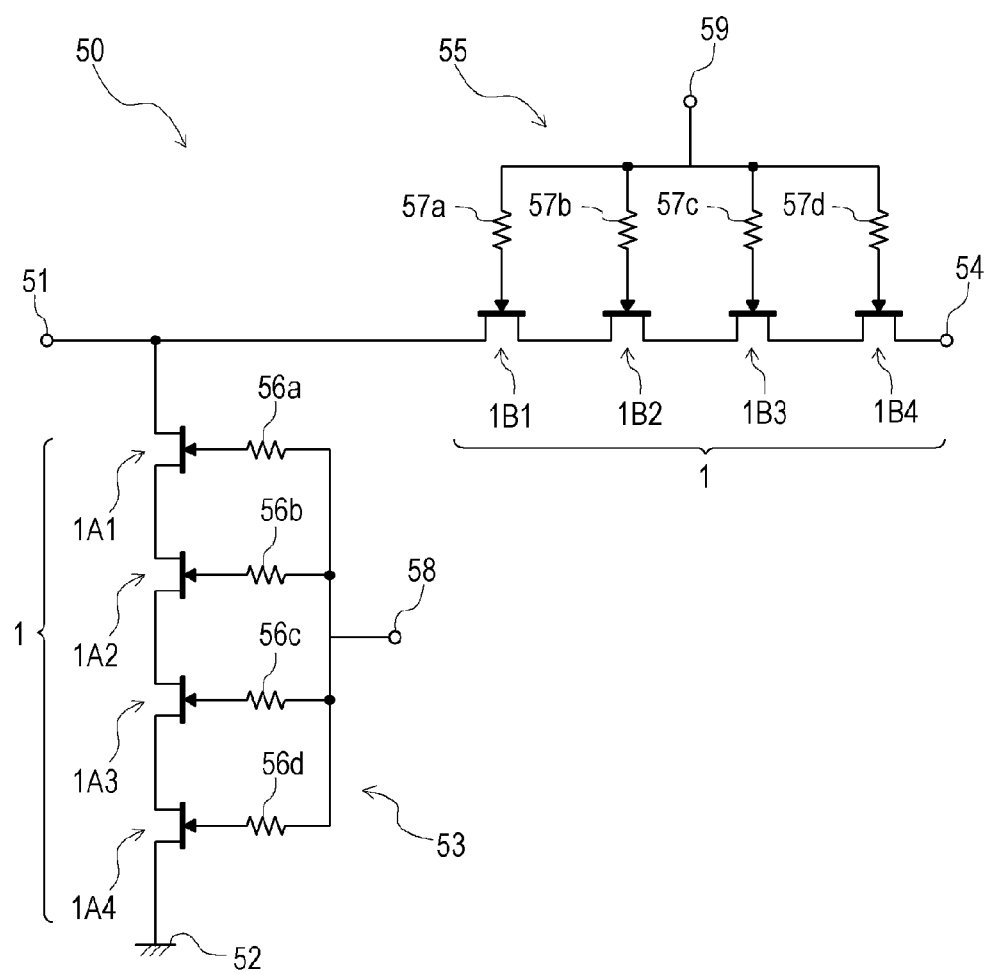
FIG. 7 is a view illustrating a configuration of a semiconductor switch circuit according to an embodiment of the present disclosure.

As shown in FIG. 7, the switch circuit 50 of the present embodiment includes a shunt circuit 53 that is a short-circuiting circuit disposed between an input terminal 51 and a ground terminal 52, and a series circuit 55 that is disposed between the input terminal 51 and an output terminal 54.

The shunt circuit 53 includes four (of four stages) FETs 1 (1 A1, 1 A2, 1 A3, and 1 A4) which are connected in series, and resistance elements 56a, 56b, 56c, and 56d which are connected with a gate of each of the FETs 1.

The series circuit 55 includes four (of four stages) FETs 1 (1 B1, 1 B2, 1 B3, and 1 B4) which are connected in series, and resistance elements 57a, 57b, 57c, and 57d which are connected with a gate of each of the FETs 1. In addition, the number of the FETs 1 in each of the shunt circuit 53 and the series circuit 55 is not limited.

In the shunt circuit 53, an input terminal 58 of a switching signal is connected, with the gate of each of the FETs 1 (1 A1, 1 A2, 1 A3, and 1 A4), in common on the four FETs 1 via the resistance elements 56a, 56b, 56c, and 56d. In the series circuit 55, an input terminal 59 of the switching signal is connected, with the gate of each of the FETs 1 (1 B1, 1 B2, 1 B3, and 1 B4), in common on the four FETs 1 via the resistance elements 57a, 57b, 57c, and 57d.

In response to the voltage applied to the input terminals 58 and 59, the switch circuit 50 having the above described configuration is operated as below. When a voltage (hereinafter, referred to as "on voltage") of a regulated value or less is applied to the input terminal 58, each of the FETs 1 (1 A1, 1 A2, 1 A3, and 1 A4) of the shunt circuit 53 is turned on, so that the input terminal 51 and the ground terminal 52 both conduct.

In addition, when a voltage (hereinafter, referred to as "off voltage") that is sufficiently lower than a regulated value is applied to the input terminal 58, each of the FETs 1 (1 A1, 1 A2, 1 A3, and 1 A4) of the shunt circuit 53 is turned off, the input terminal 51 and the ground terminal 52 are not conducted. Thus, the switch circuit 50 is turned off, so that the input terminal 51 and the output terminal 54 both pass current.

Meanwhile, when the on voltage is applied to the input terminal 59, each of the FETs 1 (1 B1, 1 B2, 1 B3, and 1 B4) of the series circuit 55 is turned on, so that the input terminal 51 and the output terminal 54 pass current. In addition, when the off voltage is applied to the input terminal 59, each of the FETs 1 (1 B1, 1 B2, 1 B3, and 1 B4) of the series circuit 55 is turned off, so that the input terminal 51 and the output terminal 54 do not pass current. Thus, the switch circuit 50 is turned on.

When the switch circuit 50 is turned on, the FETs 1 (1 A1, 1 A2, 1 A3, and 1 A4) of the shunt circuit 53 act as a capacitive component, and the FETs 1 (1 B1, 1 B2, 1 B3, and 1 B4) of the series circuit 55 act as a resistive component. When the switch circuit 50 is turned off, in each of the FETs 1 (1 B1, 1 B2, 1 B3, and 1 B4) of the series circuit 55, a high frequency signal is fed to the ground terminal 52 (a common potential) by the shunt circuit 53, so that a high frequency insulation is ensured between the input terminal 51 and the output terminal 54.

As described above, the switch circuit 50 including the FET 1 of the present embodiment includes input terminals 58 and 59 which are connected to the gate of the FET 1 via a resistance element, and is operated by a switching signal that is input to the input terminals 58 and 59. By the switch circuit 50 of the present embodiment, it is possible to improve harmonic characteristics without increasing the chip size of the semiconductor switch.

[Configuration of Mobile Phone]

A configuration of a mobile phone 70 that is an embodiment of a communication apparatus as an application example of the FET 1 of the present embodiment will be described with reference to FIG. 8. The mobile phone 70 of the present embodiment includes the above described switch circuit 50 as a semiconductor switch circuit.

Figure 8:
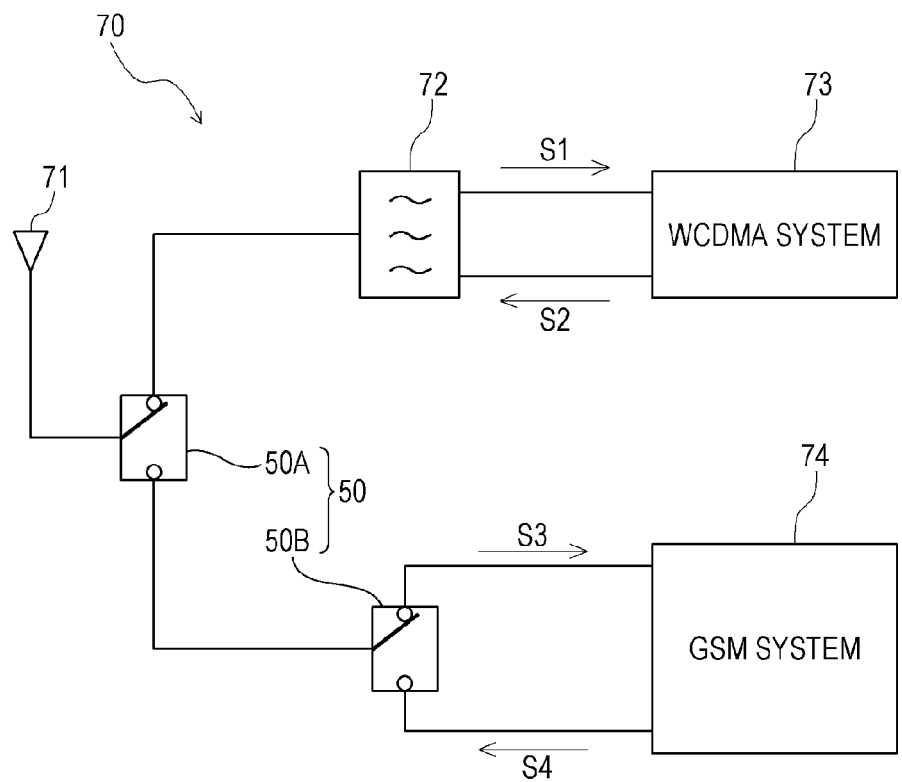
FIG. 8 is a view illustrating a configuration of a mobile phone according to an embodiment of the present disclosure.

As shown in FIG. 8, the mobile phone 70 of the present embodiment includes an antenna 71 that performs transmission and reception of radio waves that are high frequency signals, two switch circuits 50 (50A and 50B), a duplexer 72, a WCDMA system 73, and a GSM (a registered trademark) system 74. The mobile phone 70 performs transmission and reception of information using any one of the WCDMA and the GSM (the registered trademark).

In the mobile phone 70, the WCDMA system 73 is connected to the antenna 71 via the switch circuit 50A that is one of the two switch circuits 50, and the duplexer 72. In addition, the GSM (a registered trademark) system 74 is connected to the antenna 71 via the switch circuit 50A that is one of the two switch circuits 50 and the switch circuit 50B that is the other thereof.

The switch circuit 50A that is one thereof is provided between the antenna 71 and the duplexer 72 and between the antenna 71 and the switch circuit 50B that is the other thereof, and functions as a system switching device that switches whether to use any frequency band of the WCDMA and the GSM (a registered trademark). That is, by operation of the switch circuit 50A, switching of a signal path is performed so that a system that performs transmission and reception of information is switched to any one of a WCDMA system 73 and a GSM (a registered trademark) system 74.

The duplexer 72 has a filter having a different frequency band, and electrically divides a transmission path of a signal and a reception path thereof. The duplexer 72 transmits, to the WCDMA system 73, a signal received from the antenna 71 as a reception signal S1, and transmits, to the antenna 71, a transmission signal S2 transmitted by the WCDMA system 73.

The switch circuit 50B that is the other thereof is provided between the switch circuit 50A that is one thereof and the GSM (a registered trademark) system 74, and functions as a transmission/reception switch of the GSM (a registered trademark) system 74. That is, by operation of the switch circuit 50B, switching of the path of a signal is performed in order to switch a reception by the GSM (a registered trademark) system 74 of a reception signal S3 from the antenna 71, and a transmission of a transmission signal S4 from the GSM (the registered trademark) system 74.

As described above, the mobile phone 70 including the switch circuits 50A and 50B of the present embodiment performs switching of the signal path by the operations of the switch circuits 50A and 50B. By the mobile phone 70 of the present embodiment, it is possible to improve the harmonic characteristics while the chip size of the semiconductor switch of the mobile phone 70 does not incur enlargement of the device. In addition, as the communication apparatus in which the switch circuit 50 of the present embodiment is installed, for example, a portable information terminal (PDA), wireless LAN equipment, and the like, other than the mobile phone may be used.

[Example of Evaluation Results of Harmonic Characteristics]

Figure 9:
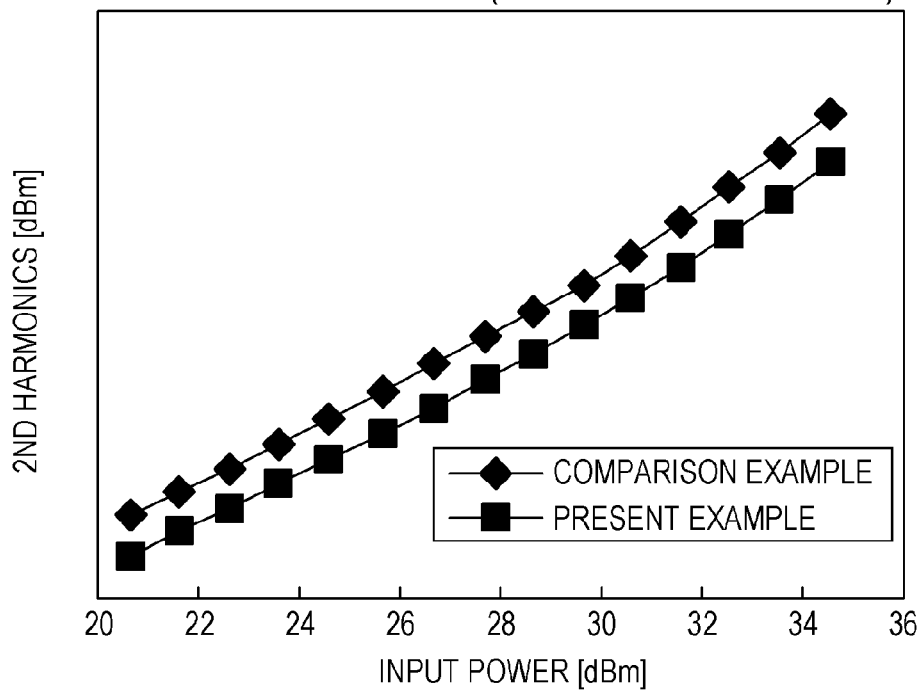
FIG. 9 is a view illustrating an example of evaluation results of second harmonic characteristics.
Figure 10:
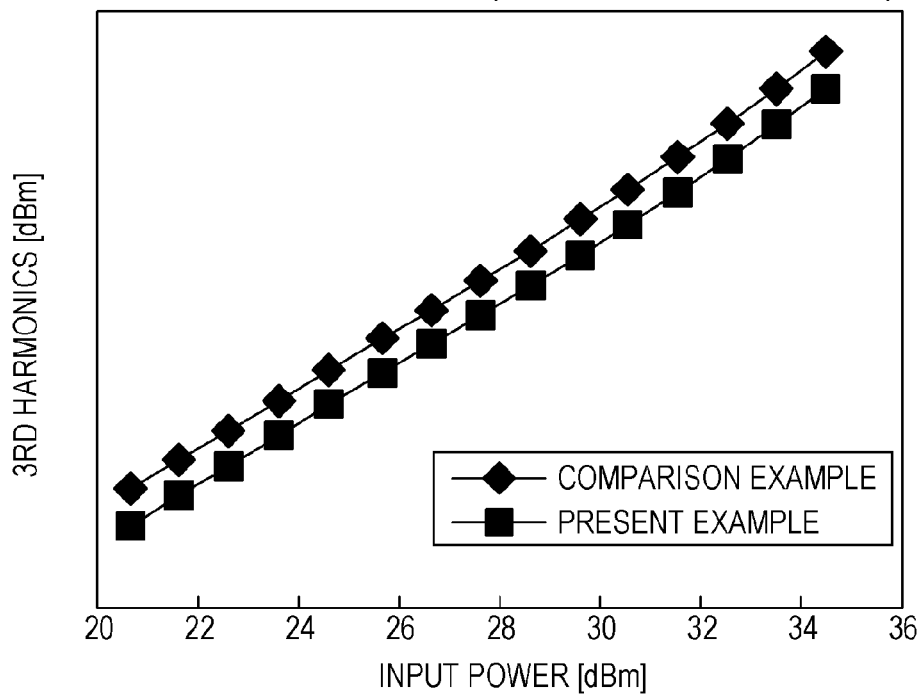
FIG. 10 is a view illustrating an example of evaluation results of tertiary harmonic characteristics.

In FIGS. 9 and 10, an example of evaluation results of harmonic characteristics of a semiconductor switch (hereinafter, referred to as "semiconductor switch relating to the present embodiment") using the configuration of the FET 1 of the present embodiment and of a semiconductor switch (hereinafter, referred to as "semiconductor switch" of comparative example) using the configuration of the FET 100 of the comparative example is shown. In addition, this evaluation relates to a case in which the FET constitutes the series circuit in the semiconductor switch. In addition, in this evaluation, the fundamental frequency is 1.95 GHz.

FIG. 9 is a graph illustrating the relationship between the input power [dBm] and second harmonics [dBm] in an on state of each of a semiconductor switch of a comparative example and a semiconductor switch relating to the present embodiment. In FIG. 9, a graph in which measuring points are indicated by squares, is a graph of the semiconductor switch relating to the present embodiment, and a graph in which measuring points are indicated by diamond shapes is a graph of the semiconductor switch of the comparative example. This is the same in the graph shown in FIG. 10.

As seen from the graph shown in FIG. 9, from the comparison between the semiconductor switch relating to the present embodiment and the semiconductor switch of the comparative example, the output of the second harmonics is reduced in the semiconductor switch relating to the present embodiment compared to the semiconductor switch of the comparative example, although a ratio of an increase in the output of the second harmonics to the increase in the input power is almost the same. Specifically, in this evaluation, when compared at the same input power, it is found that the output of the second harmonics is improved by about 3.5 dBm in the semiconductor switch of the present embodiment in comparison with the semiconductor switch of the comparative example.

FIG. 10 is a graph illustrating the relationship between the input power [dBm] and third harmonics [dBm] in an on state of each of a semiconductor switch of a comparative example and a semiconductor switch relating to the present embodiment. Even in the third harmonics, similar results to those in the second harmonics have been obtained That is, as seen from the graph shown in FIG. 10, from the comparison between the semiconductor switch relating to the present embodiment and the semiconductor switch of the comparative example, an output of the third harmonics is reduced in the semiconductor switch relating to the present embodiment rather than the semiconductor switch of the comparative example, although a ratio of an increase in the output of the third harmonics to an increase in the input power is almost the same. Specifically, in this evaluation, when compared at the same input power, it is found that the output of the third harmonics is improved by about 3.5 dBm in the semiconductor switch of the present embodiment in comparison with the semiconductor switch of the comparative example.

As described above, based on these evaluation results, the FET 1 of the present embodiment is used, so that it is possible to suppress the second harmonics and the third harmonics with respect to the FET 100 of the comparative example, thereby improving the harmonic characteristics.

The present disclosure contains subject matter related to that disclosed in Japanese Priority Patent Application JP 2011-036537 filed in the Japan Patent Office on Feb. 23, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A field effect transistor, comprising:
   a source wiring that is formed on a compound semiconductor substrate, and has a plurality of source electrodes arranged in parallel to each other at predetermined intervals;
   a drain wiring that is formed on the compound semiconductor substrate, and has a plurality of drain electrodes arranged in parallel to each other at predetermined intervals and alternatively disposed in a parallel direction of the plurality of source electrodes;
   a gate wiring that is formed on the compound semiconductor substrate, and has a portion located between the source electrode and the drain electrode which are adjacent to each other at least in the parallel direction; and
   a plurality of buried gate layers that is formed under the gate wiring in a region in which the gate wiring is formed, and is independently provided between each electrode of the plurality of source electrodes and the plurality of drain electrodes.

2. The field effect transistor according to claim 1, wherein each of the plurality of buried gate layers is formed in a straight-line shape by a portion existing within an operation region on the compound semiconductor substrate including a portion in which the source electrode and the drain electrode overlap in the parallel direction between the source wiring and the drain wiring, and by a portion existing in a region other than the operation region, and
the portion existing in the region other than the operation region has a minimum length used to ensure operation in the operation region.

3. A semiconductor switch circuit comprising:
the field effect transistor according to claim 1; and
an input terminal connected to a gate of the field effect transistor through a resistance element,
wherein the field effect transistor is operated by a switching signal input to the input terminal.

4. A communication apparatus comprising:
the semiconductor switch circuit according to claim 3,
wherein the communication apparatus performs path switching of a signal by an operation of the semiconductor switch circuit.

* * * * *